United States Patent [19]

Dufilie

[11] Patent Number: 5,021,699

[45] Date of Patent: Jun. 4, 1991

[54] INTERDIGITAL TRANSDUCER FOR SURFACE ACOUSTIC WAVE FILTER

[75] Inventor: Pierre Dufilie, Le Rouret, France

[73] Assignee: Thomson-CSF, Puteaux, France

[21] Appl. No.: 419,207

[22] Filed: Oct. 10, 1989

[30] Foreign Application Priority Data

Oct. 14, 1988 [FR] France ............................ 88 13536

[51] Int. Cl.$^5$ .......................................... H01L 41/08
[52] U.S. Cl. ................................. 310/313 B; 333/195
[58] Field of Search ............................. 333/193–196, 333/154; 310/313 R, 313 B, 313 C, 313 D

[56] References Cited

U.S. PATENT DOCUMENTS

| 3,936,774 | 2/1976 | Mellon et al. | 310/313 R X |
| 3,990,023 | 11/1976 | Kodama | 310/313 R X |
| 4,144,507 | 3/1979 | Shreve | 310/313 D X |
| 4,206,380 | 6/1980 | Hazama et al. | 333/194 X |
| 4,365,220 | 12/1982 | Hikita | 333/195 |
| 4,577,169 | 3/1986 | Meeker et al. | 333/193 X |

FOREIGN PATENT DOCUMENTS 153817 11/1981 Japan ................................ 333/194

OTHER PUBLICATIONS

IEEE Transactions on Sonics and Ultrasonics, vol. SU-26, No. 4, Jul. 1979, pp. 308–312, IEEE, New York, US; F. Sandy.

Primary Examiner—Benny Lee
Attorney, Agent, or Firm—Oblon, Spivak, McClelland, Maier & Neustadt

[57] ABSTRACT

To reduce the frequency bandwidth of an interdigital transducer, acting as an image-impedance connected interdigital transducer in a surface acoustic wave filter with low insertion losses, at least the center-to-center spacing between a first electrode or finger of a first comb, central to the transducer, and a second finger of a second adjacent comb is equal to $R\lambda_0/2$, where $\lambda_0$ is the central wavelength and R is a whole number strictly greater than 1. The center-to-center spacings between the other first and second fingers are at least equal to $R\lambda_0/2$. An increase in the optimal length of an image-impedance connected interdigital transistor is obtained by reducing the number of active fingers per unit of length. The greater the reduction factor chosen, the narrower will be the frequency band of the transducer.

2 Claims, 5 Drawing Sheets

R=2

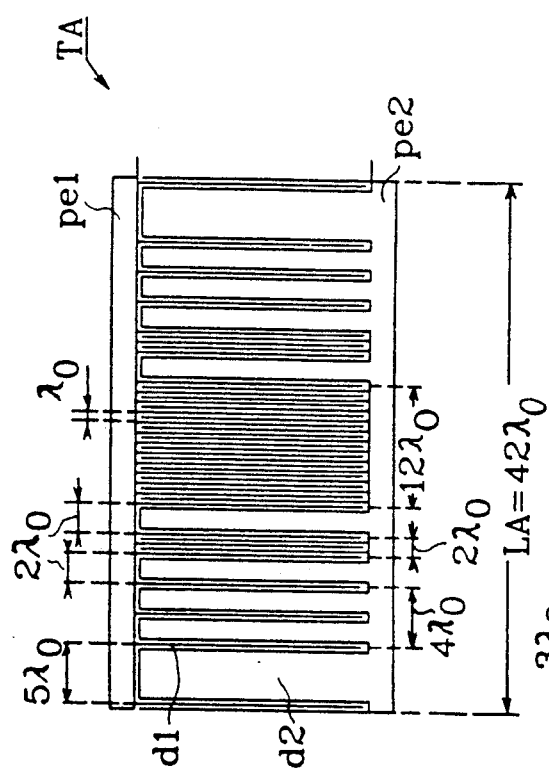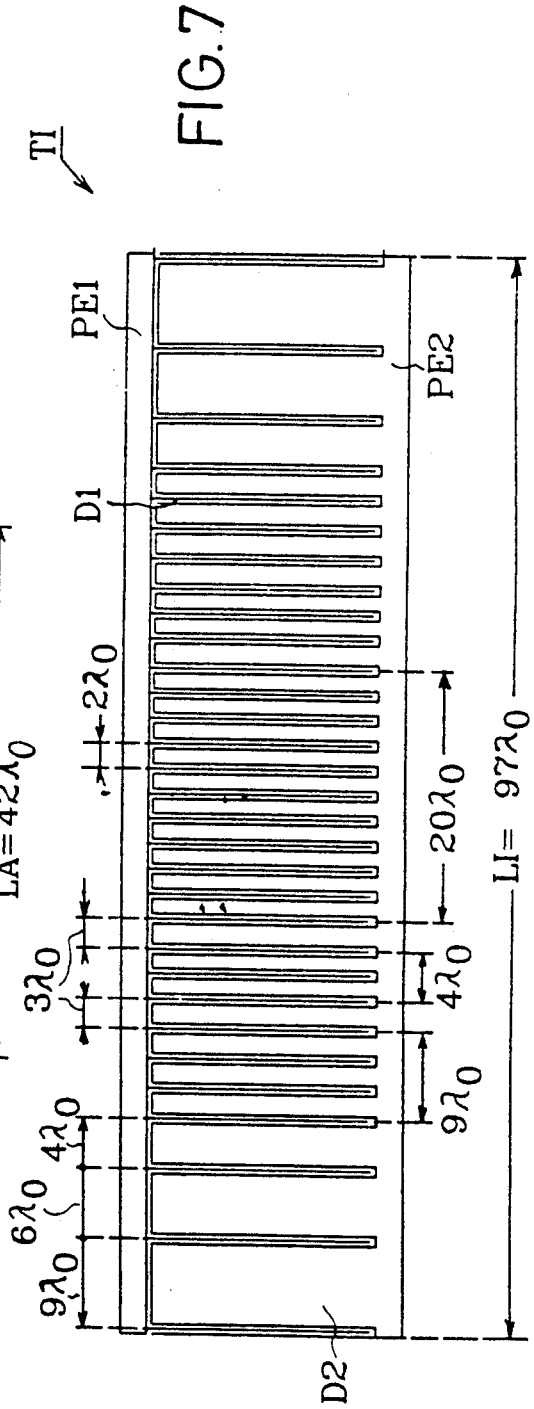

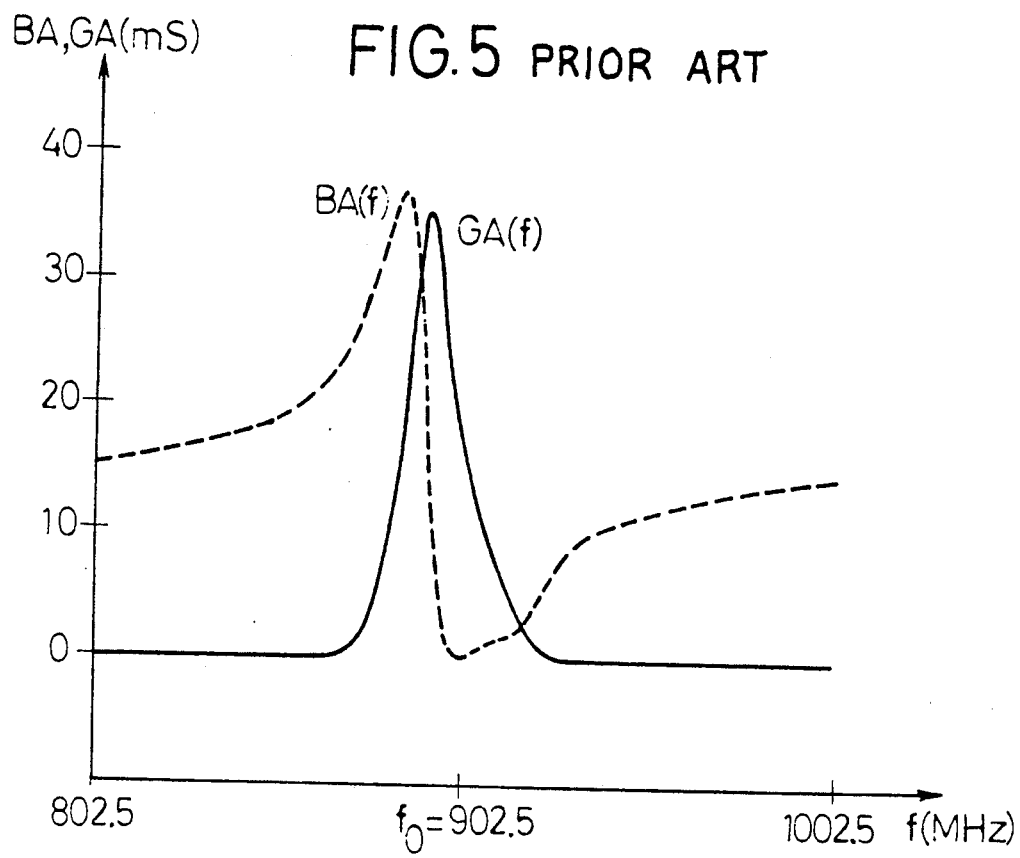
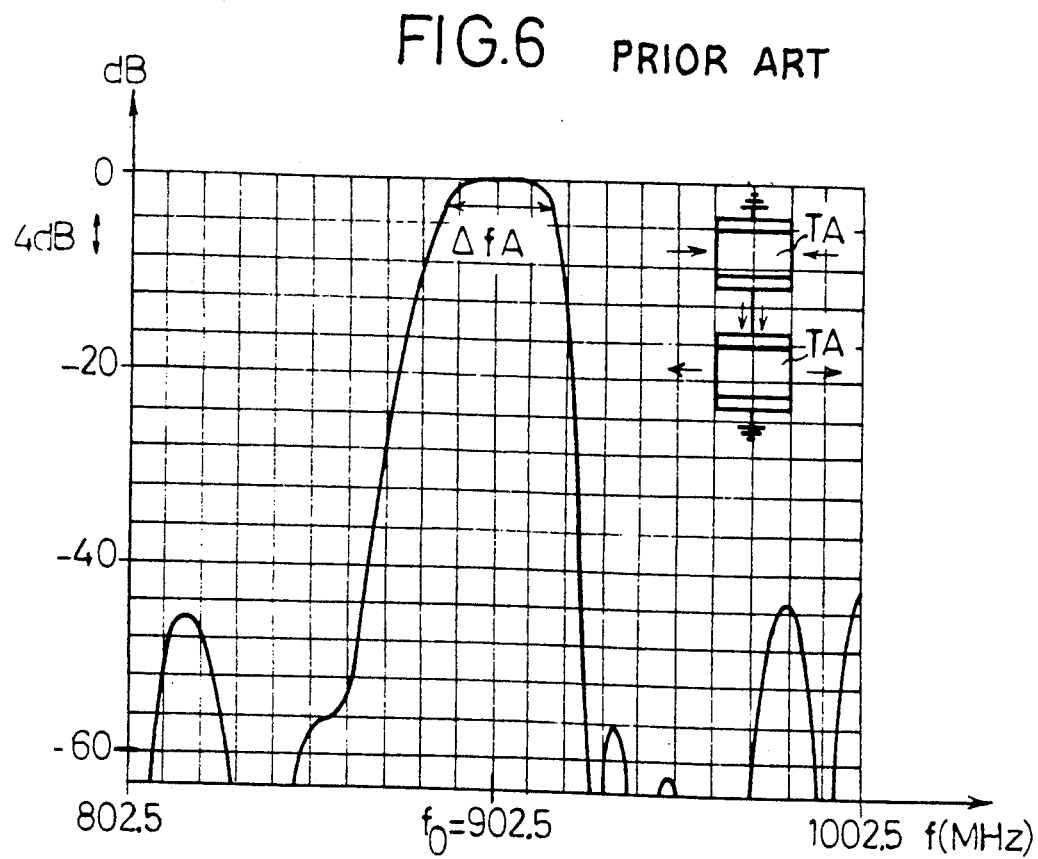

INTERDIGITAL TRANSDUCER FOR SURFACE ACOUSTIC WAVE FILTER

BACKGROUND OF THE INVENTION

1. Field of the Invention

The present invention concerns a transducer with metallic electrodes interdigitated in comb form and deposited on a piezoelectric substrate. The transducer is included, particularly, in a surface acoustic wave filter.

In such filters, it is sought to reduce the insertion losses, which are fairly high, to the maximum extent. The interdigital transducers must be significantly mismatched to reduce the effect of the stray echos of the acoustic wave being propagated in the filter where the losses generally exceed 20 dB.

2. Description of the Prior Art

To reduces insertion losses, it is known to make filters with interdigited transducers with conjugated admittances. This type of filter is described in the article by M. HIKITA et al., "HIGH PERFORMANCE SAW FILTERS WITH SEVERAL NEW TECHNOLOGIES FOR CELLULAR RADIO", IEEE Trans. Microwave Theory Tech., vol. 33, No. 6, pages 510 to 517, 1985.

Referring to the appended FIG. 1, which corresponds to FIG. 8a of the above-mentioned article, this type of filter has two parallel input and output parallel acoustic channels VE and VS on a main surface of the substrate. These two channels have several juxtaposed coupling cells in common, for example $CE_1$ and $CE_2$ according to the illustrated embodiment. Each cell $CE_1$, $CE_2$ includes two interdigital input transducers TE connected to an input terminal BE of the filter, two interdigital output transducers TS connected to an output terminal BS of the filter, and two intermediate interdigital transducers called image-impedance connected interdigital transistors (IDTs) TC in the channels VE and VS respectively. The two image-impedance connected IDTs are placed, respectively, between the two input transducers TE and the two output transducers TS, and are series connected. Two consecutive cells of the filter have an input transducer and an output transducer in common. The filter also has reflecting gratings RE and RS at the ends of each of the channels VE and VS.

The image-impedance connected interdigital transducers TC contribute to a reduction in the losses due to the two-directional nature of the transducer. As shown in the appended FIG. 2, each image-impedance connected IDT has two facing, periodic, metallized combs, pe1 and pe2 with electrodes in the form of parallel, alternating fingers d1 and d2. The metallization spacing p between two adjacent fingers d1 and d2 is equal to the acoustic half wavelength $\lambda/2$, which corresponds to a finger-to-finger spacing equal to $\lambda$ each of the combs pe1 and pe2, as is known in transducers with interdigital electrodes. The width (a) of each of the fingers d1 and d2 is constant and equal to or smaller than $\lambda/4$. Thus the interval between the fingers is equal to p-a.

Under these conditions, the electrodes of the image-impedance connected IDT are equivalent to acoustic sources, the vibrations of which are added up in phase for frequencies corresponding to wavelengths close to twice the metallization spacing p. The cutoff frequency band of the transducer is then given by:

$$2\pi - 2\Delta \leq \psi_c \leq 2\pi + 2\Delta \text{ radians}$$

where $\psi_c$ is the electrical angle corresponding to the physical length 2p between two adjacent fingers in a comb, and $\Delta$ is giving by $|\Gamma| = \sin \Delta$ where $\Gamma$ is the measured coefficient of reflection of a finger.

To ensure that a filter such as this behaves satisfactorily in its pass band, the above-mentioned article recommends that the number of active fingers in each of the image-impedance connected IDTs should be substantially equal to $1.5/k^2$, where $k^2$ designates the electromagnetic coupling coefficient of the substrate. When this condition is achieved, the radiation susceptance B(f) of the transducer remains close to zero in a frequency band with a relative width of the order of $k^2$. This band shows very steep sides and practically no ripple.

However, the level of the minor lobes remains high, of the order of 20 dB, and the image-impedance connected IDTs have to be weighted to reduce the level of these lobes.

According to the prior art, two techniques are recommended to carry out this weighting. According to a first technique, called "apodization", and illustrated in FIG. 3a of the above-mentioned article, the length of the electrodes or fingers of the combs gradually diminishes on either side of the central active finger of the transducer. According to a second technique, called a "stairway" technique and illustrated in FIG. 3b of the above-mentioned article, the active fingers of uniform width have stepped configurations which are symmetrical, two by two, on either side of the rectilinear, central active finger of the transducer.

Furthermore, a third weighting technique may be considered according to the article by Clinton S. Hartmann, entitled "WEIGHTING INTERDIGITAL SURFACE WAVE TRANSDUCERS BE SELECTIVE WITHDRAWAL OF ELECTRODES", Ultrasonics Symposium Proceedings, IEEE, 1973, p. 423 to 426. This technique consists in selectively withdrawing electrodes or fingers in the first comb and/or the second comb of the transducer.

The present invention seeks to reduce the frequency bandwidth of an interdigital transducer designed, notably, to serve as an image-impedance connected IDT in a surface acoustic wave filter with low insertion losses.

SUMMARY OF THE INVENTION

It is an object of the present invention to provide a symmetrical interdigital transducer capable of propagating an acoustic wave having a pre-determined central wavelength $\lambda_0$. The transducer includes a first comb having first electrodes or fingers and a comb having second electrodes or fingers arranged alternately on a substrate. The first and second electrodes having their widths established along the direction of the propagation of an acoustic wave with the center-to-center spacing between a first finger of the first comb and a second finger of the second comb adjacent to the first finger being at least equal to $R\lambda_0/2$, where R is a whole number greater than 1 for the greatest part of the fingers and wherein the width of the second fingers is at least equal to $2(R-1)p+a$, wherein a designates the width of the first fingers smaller than $\lambda_0/2$ and wherein p is equal to $\lambda_0/2$.

Thus, compared with the prior art, the invention recommends an increase in the optimim length of each image-impedance connected IDT by reducing the number of active fingers per unit of length. The greater the chosen factor of reduction, the smaller will be the frequency band of the transducers.

BRIEF DESCRIPTION OF THE DRAWINGS

Other features of the invention will appear more clearly from the following description, made with reference to the corresponding appended drawings, of which:

FIG. 4 is a top view of a prior art transducer obtained according to the "electrode or finger withdrawal" technique;

FIGS. 5 and 6 respectively show variations in radiation conductance and susceptance and the response as a function of the frequency for the known transducer shown in FIG. 4;

FIG. 7 is a top view of a "electrode withdrawal" type transducer according to the invention.

DESCRIPTION OF A PREFERRED EMBODIMENT

Figure 2:
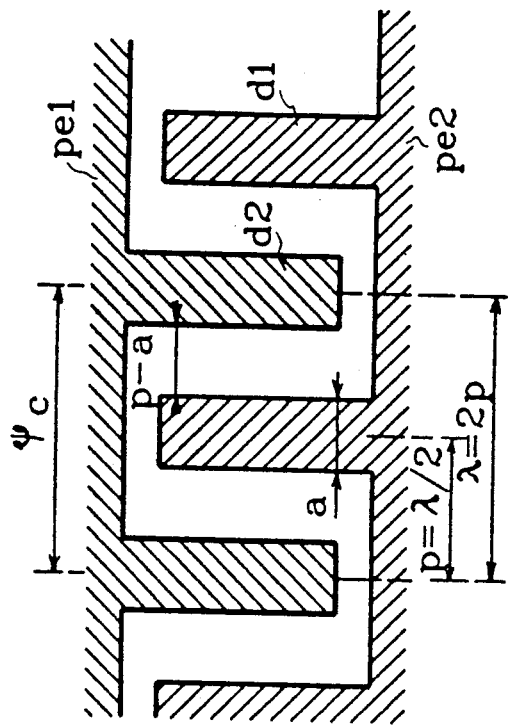
FIG. 2 shows a portion of the structure of a known image-impedance connected IDT, already commented upon above.
Figure 3:
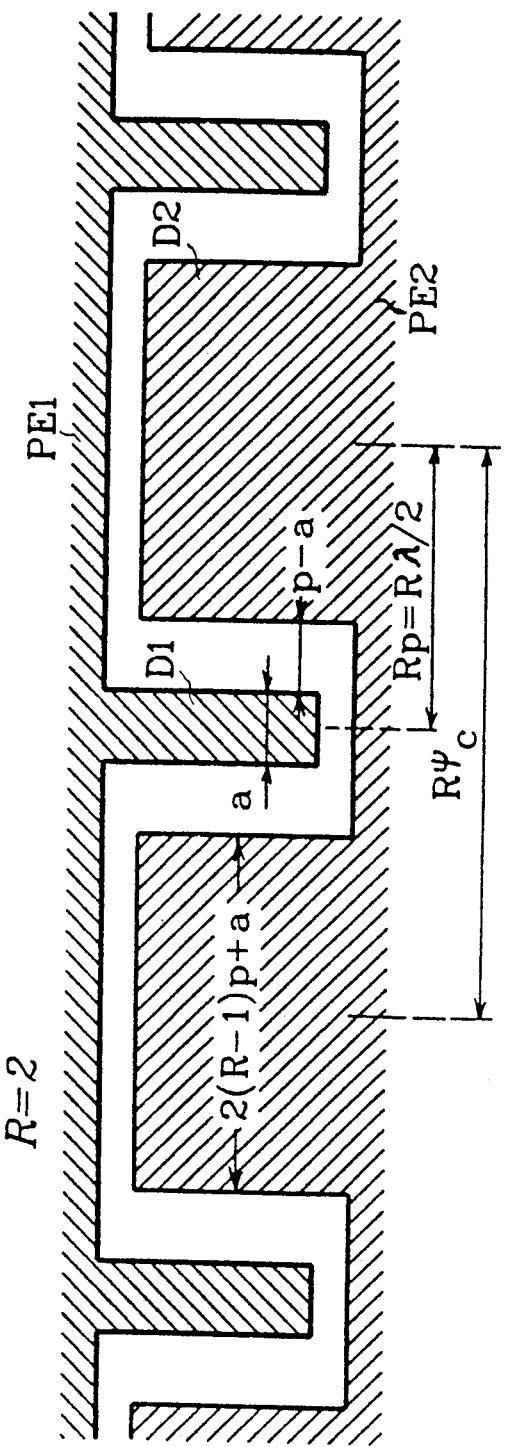
FIG. 3 shows a portion, preferably a central one, of the structure of a transducer according to the invention.

Referring to FIG. 3, a periodic group of pairs of fingers, preferably located at the center of a symmetrical interdigital transducer according to the invention has a metallization spacing equal to Rp. The spacing is defined by the center-to-center spacing between an electrode or finger D1 of a first comb PE1, such as the active comb of the transducer, and an electrode of finger D2 of the second comb PE2, such as the ground combs of the transducer. In this length R, $p = \lambda/2$, $\lambda/2$ is equal to the spacing in the known transducer, shown in FIG. 2. The factor R is a whole number that is strictly greater than 1, and equal to 2 according to the embodiment shown in FIG. 3.

Thus, as compared with the known structure of FIG. 2, the structure according to FIG. 3 is deduced therefrom by periodically removing $R-1$ fingers from the active comb. At least the central structure of the combs according to the invention therefore has a periodicity or finger-to-finger spacing equal to 2RP, and an optimal length which is R times greater than the length according to FIG. 2. In other words, the number of fingers per unit length of the structure is reduced to the factor R.

The first fingers D1 have a width (a) which is smaller than $\lambda/2$, preferably of the order of $\lambda/4$, and equal to that of the fingers d1 and d2 in the first and second combs according to the prior art. Similarly, the interelectrode space between two facing sides of the first and second adjacent fingers D1 and D2 remains unchanged and is equal to (p-a). Consequently, the width of a second finger D2 is equal to:

$$2Rp - 2(p-a) - 2a/2 = 2(R-1)p + a$$

and is considerably greater than the width of the second fingers d2 according to FIG. 2. Therefore the interval between the fingers is equal to p-a.

The cutoff frequency bandwidth of this "reduced" structure is approximately given by:

$$2R\pi - 2\Delta \leq R\psi_c \leq = 2R\psi + 2\Delta \text{ radians}$$

where $R\psi_c$ is the electrical angle corresponding to the physical length between two adjacent fingers and a comb.

The cutoff bandwidth is thus reduced by a ratio close to 1/R as compared with a "non-reduced" structure according to FIG. 2.

As this entails the lowering of the level of the minor lobes of the transfer function of a transducer according to the invention, this lowering is obtained by any one of the previously mentioned prior art techniques, namely by the lengths of fingers in each of the variable combs (apodization), or by "staircase" shapes of the fingers, or by "withdrawal" of fingers.

As an example, experimental results are indicated herebelow for a prior art transducer TA and a transducer TI according to the invention, both being of a "electrode or finger withdrawal" type. The piezoelectric substrate of these transducers is made of lithium niobate $LiNbO_3$, Y cut (128°), having an electromagnetic coupling coefficient $k^2 = 0.056$. The central frequency of the transducer is equal to 902.5 MHz, which corresponds to a wavelength $\lambda_o = 2.16$ $\mu$m and an acoustic aperture OU equal to 150 $\mu$m.

As shown in FIG. 4, the transducer TA according to the prior art has $1.5/k^2 \cong 27$ first active fingers d1 which are distributed in a central group having 13 fingers evenly spaced out by $\lambda_0$ and having a length of $12\lambda$, two first symmetrical groups, each having three fingers evenly spaced out by $\lambda_0$, two second symmetrical groups having a length of $4\lambda$, each having three fingers evenly spaced out by $2\lambda$, and two end symmetrical rings spaced from the second group by $5\lambda$. As can be seen in FIG. 4, an active finger has been withdrawn between the central group and each first group, an active finger has been withdrawn between each first group and the second neighbouring group, and four active fingers have been withdrawn between each each second group and the neighbouring end finger. The active length of the transducer TA is thus equal to $LA = 42\lambda_0$.

Figure 1:
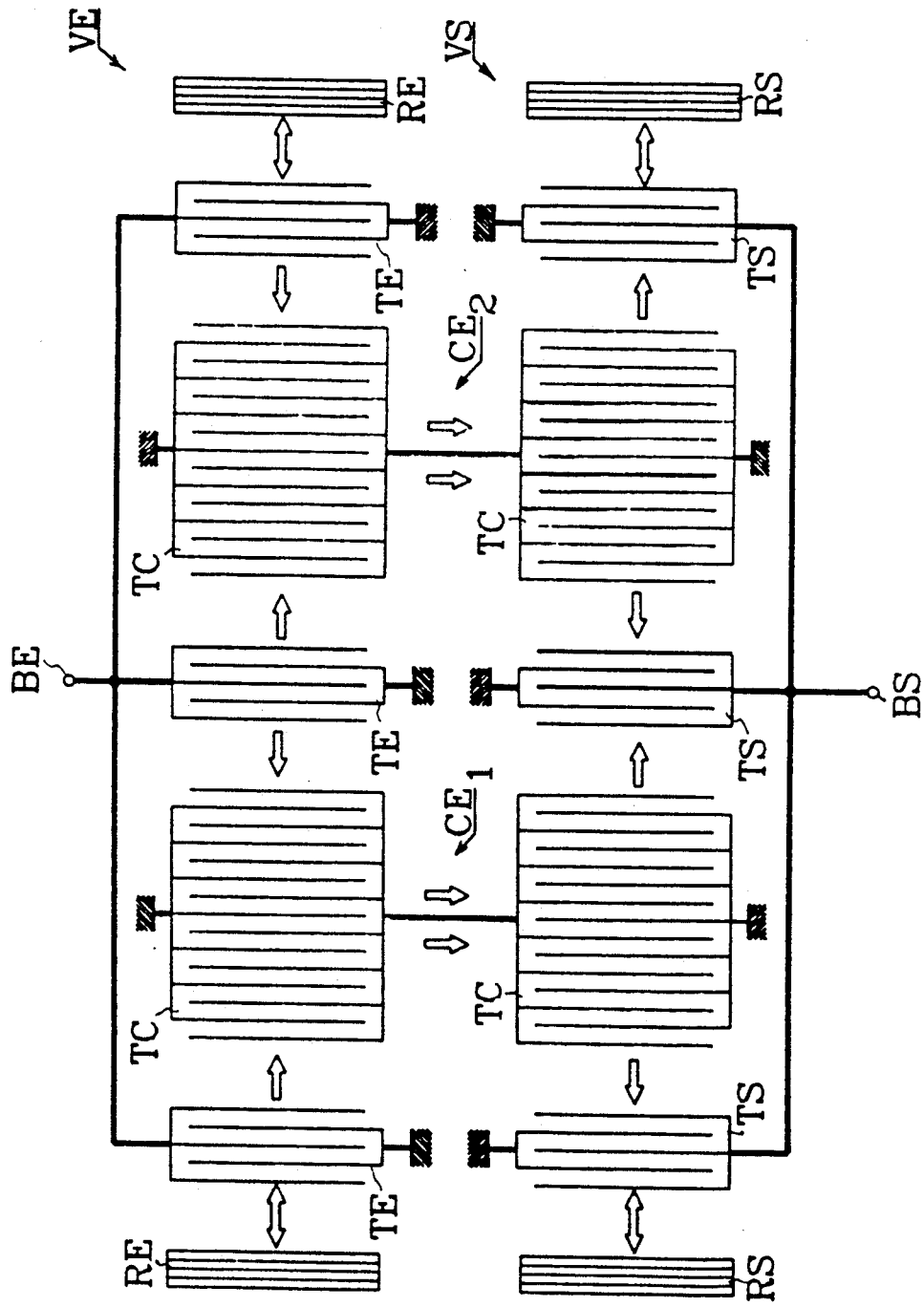
FIG. 1 is a schematic top view of a surface acoustic wave filter with image-impedance connected IDTs according to the prior art, already referred to above.

For the transducer TA, the variations in the conductance GA and the susceptance BA as a function of the frequency are shown in FIG. 5. The frequency response of two transducers TA, coupled to form an elementary cell with two image-impedance connected interdigital transducers TC in a filter as shown in FIG. 1 is shown in FIG. 6. The bandwidth at $-3$dB for this cell is equal to $\Delta fA = 30.6$ MHz.

Referring to FIG. 7, the transducer TI according to the invention forms an image-impedance connection interdigital transducer, also according to the "finger or electrode withdrawal" technique, namely one in which the center-to-center spacing between the first and second adjacent fingers D1 and D2 and/or between groups of alternated first and second fingers increase gradually and symmetrically from the center of the transducer onwards. The transducer TI has 31 active fingers distributed in a central group having 11 fingers evenly spaced out by $R\lambda_0 = 2\lambda_0$ and having a length of $20\lambda_0$, two first symmetrical groups, each having three fingers evenly spaced out by $2\lambda_0$ and having a length of $4\lambda_0$, two symmetrical second groups each having four fingers evenly spaced out by $3\lambda_0$ and having a length of $9\lambda_0$, and two end symmetrical groups having three fingers which are respectively spaced out by $4\lambda_0$, $6\lambda_0$ and $9\lambda_0$ from the second neighbouring group onwards. The spacing between the central group and each first group is equal to $3\lambda_0$, and the space between each first group and the second neighbouring group is equal to $3\lambda_0$. The active length L1 of the transducer TI is thus equal to $97\lambda_0$.

Figure 8:
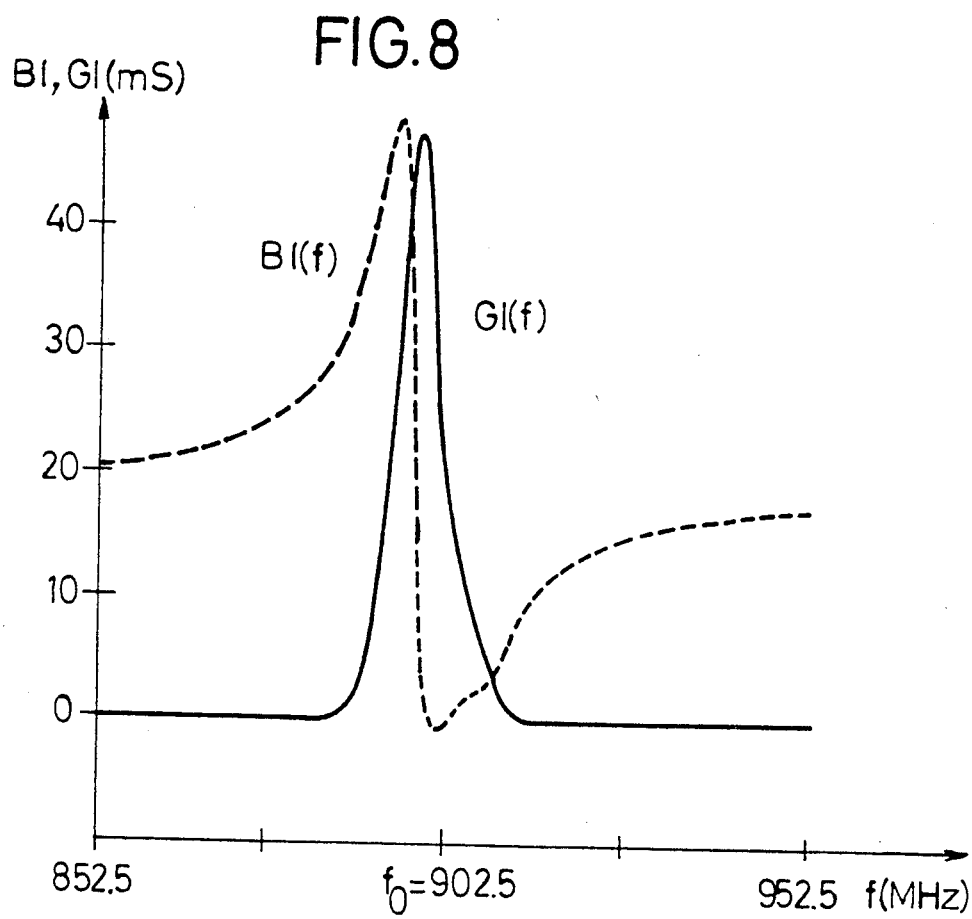
FIGS. 8 and 9 respectively show variations in radiation conductance and susceptance and the response as a function of the frequency for the transducer, according to the invention, shown in FIG. 7.
Figure 9:
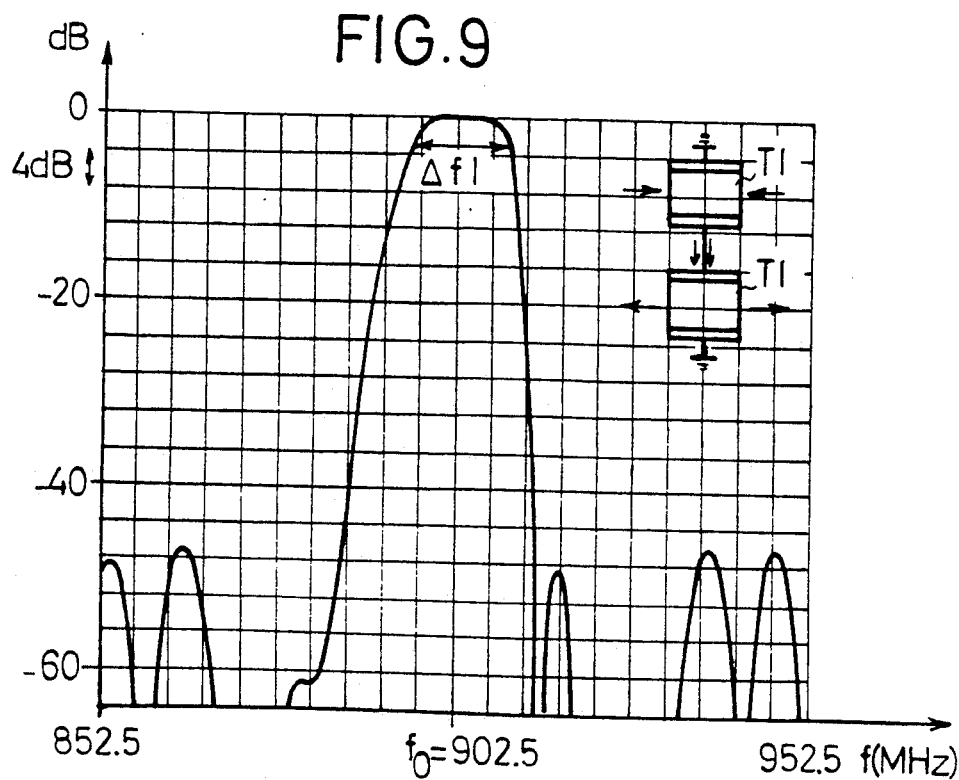

In a manner similar to that of FIGS. 5 and 6, but for a frequency band reduced by a factor of 2, the FIGS. 8 and 9 respectively indicate the variations in conductance GI and susceptance BI of the transducer TI as a function of the frequency, and the frequency response of two transducers TI forming a coupling cell made with two connected cells TC in the filter of FIG. 1.

The bandwidth $\Delta$d1 with $-3$ dB attenuation for the two-transducer cell TI is equal to 13.5 MHz. This width thus corresponds to a reduction of $30.6/13.5 = 2.3$ with respect to the bandwidth of the pair of transducers TA. This reduction is close to the ratio by which the lengths of the transducers are increased, that is, LI/LA $= 97/42 = 2.3$ with LI and LA being the respective lengths of the transducers.

The above-described examples are restricted to a relatively small number of fingers, but it is well known that surface acoustic wave filters may commonly comprise a far greater number of fingers, which may go up a figure of several hundreds. Under these conditions, it is clear that the presence, for various reasons, of a small number of fingers for which $R=1$, will only slightly modify the response curve and that the result of the invention will always be obtained. The scope of the invention therefore extends to such filters.

What is claimed is:

1. A symmetrical, interdigital transducer, capable of propagating an acoustic wave along a given direction having a predetermined central wavelength $\lambda_0$, and comprising a first comb having first electrodes or fingers and a second comb having second electrodes or fingers arranged alternately on a substrate, and first and second electrodes having given widths along the direction of propagation of said acoustic wave wherein a center-to-center spacing between a first finger of said first comb and a second finger of said second comb adjacent to said first finger is at least equal to $R\lambda_0/2$, where R is a whole number strictly greater than 1 for the greatest part of the fingers, and wherein the width of the second fingers is at least equal to $2(R-1)p+a$, where a designates said width of the first fingers which are smaller than $\lambda_0/2$ and p is equal to $\lambda/2$.

2. A transducer according to claim 1, wherein said adjacent fingers are assembled in a vertical group and a symmetrical group placed symmetrically relative to a center position of the transducer in relation to the direction of propagation of the acoustic waves and wherein the center-to-center spacings between the first and second adjacent fingers and the distances between alternating groups of first and second fingers increase gradually and symmetrically from the center of the transducer, each of the said center-to-center spacings or distances being equal to $M\lambda_0/2$, where M is a whole number equal to or greater than R.

* * * * *